(12) United States Patent
Sundahl

(10) Patent No.: US 7,277,066 B2
(45) Date of Patent: Oct. 2, 2007

(54) REPAIRABLE TILED DISPLAYS

(75) Inventor: Robert C. Sundahl, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 794 days.

(21) Appl. No.: 09/906,342

(22) Filed: Jul. 16, 2001

(65) Prior Publication Data

US 2003/0011724 A1    Jan. 16, 2003

(51) Int. Cl.
*G09G 5/00* (2006.01)
*G02F 1/1333* (2006.01)
*C09K 19/00* (2006.01)
*G01R 27/28* (2006.01)

(52) U.S. Cl. .................. 345/1.3; 345/5; 345/6; 349/74; 428/1.5; 445/25; 702/117

(58) Field of Classification Search ........... 345/1.1, 345/1.3, 5, 6, 9, 904, 905; 257/98–100; 349/73, 349/74, 90, 110, 155, 1; 313/506; 315/169.3; 427/96.1, 97.2; 445/23–25

See application file for complete search history.

(56) References Cited

U.S. PATENT DOCUMENTS

| 5,644,327 | A  |   | 7/1997  | Onyskevych et al. ......... 345/80 |
| 5,693,170 | A  | * | 12/1997 | Li ............................... 156/299 |
| 5,867,236 | A  | * | 2/1999  | Babuka et al. ................ 349/73 |
| 5,880,705 | A  |   | 3/1999  | Onyskevych et al. ......... 345/80 |
| 6,097,455 | A  | * | 8/2000  | Babuka et al. ................ 349/73 |
| 6,285,343 | B1 | * | 9/2001  | Brody ......................... 345/1.1 |
| 6,498,592 | B1 | * | 12/2002 | Matthies ..................... 345/1.1 |
| 6,743,069 | B2 | * | 6/2004  | Palanisamy .................. 445/25 |

OTHER PUBLICATIONS

P. Palanisamy, U.S. Appl. No. 09/904,239, filed Jul. 12, 2001, entitled "Facilitating the Spread of Encapsulant Between Surfaces of Electronic Devices".

* cited by examiner

*Primary Examiner*—Henry N Tran
(74) *Attorney, Agent, or Firm*—Trop, Pruner & Hu, P.C.

(57) ABSTRACT

A tiled display may be formed by temporarily securing a plurality of modules to a substrate. Thereafter, the tiled array may be tested to insure that each module is functional. If each module is functional, the modules may be permanently secured to the substrate. If any modules are defective, they may be replaced and the tiled array may be retested.

20 Claims, 3 Drawing Sheets

REPAIRABLE TILED DISPLAYS

BACKGROUND

This invention relates generally to tiled displays wherein a plurality of modules are assembled together, each creating a portion of the overall image developed by the tiled display.

For a number of reasons, including manufacturing convenience, it may be desirable to produce displays from a plurality of tiles or modules. The tiles may be abutted together in a matrix or array to create an overall image made up of the contributions of each of the individual tiles or modules.

One problem that arises is that if any one of the plurality of tiles in the overall array is bad, it may be necessary to discard the entire tiled display. This necessarily results in relatively higher costs. The higher cost may arise from the need to have extremely tight control on the manufacturing of each module. Alternatively, it may arise from the cost of discarding the entire display because one of a large number of modules is defective.

Thus, there is a need for a way to make tiled displays in which it is not necessary to discard the entire display because one module is defective.

DETAILED DESCRIPTION

Figure 1:
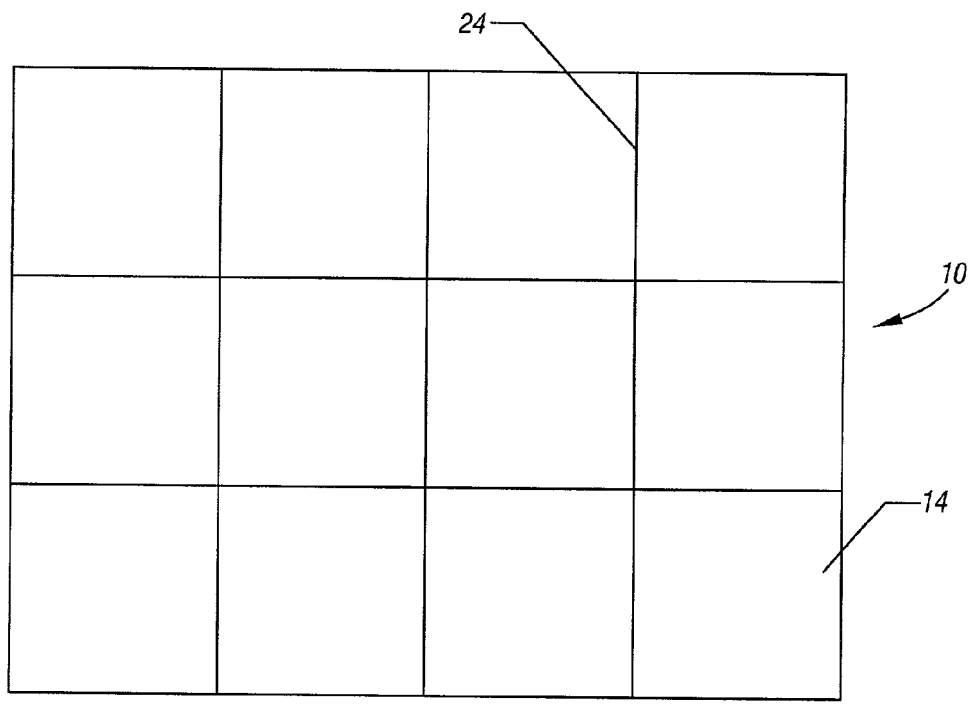
FIG. 1 is a front elevational view of a tiled display in accordance with one embodiment of the present invention.

Referring to FIG. 1, a tiled display 10 may be made up of an array of modules 16 that intersect along gaps or joints 24. In one embodiment, the tiled display 10 may use organic or polymer light emitting display (OLED) materials. In other embodiments, any emissive material may be utilized. In still other embodiments, the display 10 may be any type of display, including plasma displays and liquid crystal displays, to mention additional examples. Both emissive displays and reflective displays may be utilized in embodiments of the present invention.

In accordance with one embodiment of the present invention, the individual modules 16 may abut along joints 24 and may be secured ultimately to a substrate or optical integrating plate 14. In one embodiment of the present invention, the optical integrating plate 14 may be substantially transparent and light developed by the module 16 may exit through the plate 14.

Figure 2:
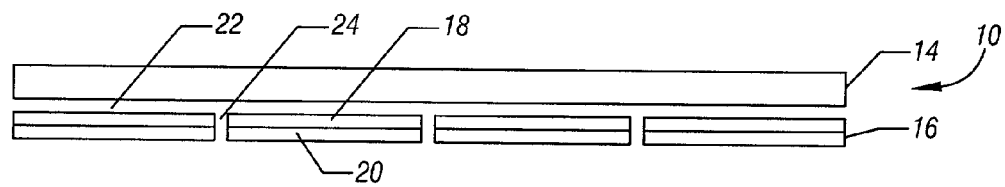
FIG. 2 is a side elevational view of the embodiment shown in FIG. 1 during the manufacturing process.

Referring to FIG. 2, in one embodiment, each module 16 may be made up of two layers 18 and 20. The layer 18 may be substantially transparent and may have pixel elements formed thereon in one embodiment of the present invention. The pixel elements may be emissive or organic light emitting material as two examples. The layer 18 may be electrically coupled to the layer 20. The layer 20 may couple the individual pixels or subpixels to an external circuit in one embodiment of the present invention. In one embodiment, the layers 18 and 20 may be coupled by surface mount connections.

Figure 3:
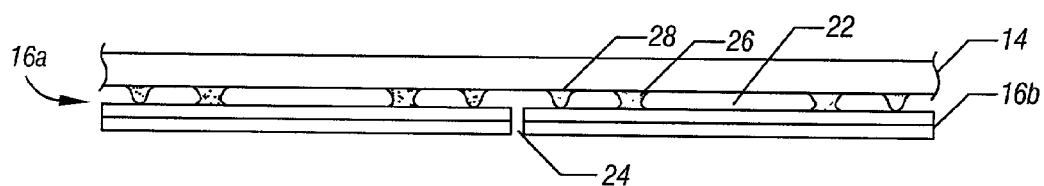
FIG. 3 is a side elevational view of the display shown in FIG. 2 subsequently in the manufacturing process in accordance with one embodiment of the present invention.

Referring next to FIG. 3, the optical integrating plate 14 may be positioned on each of the modules 16 (such as the modules 16a and 16b) by a spacer 28. For example, the spacer 28 may be pre-attached to the optical integrating plate 14. The spacer 28 may define an air gap between each module 16 and the plate 14 in one embodiment. In addition, a releasable adhesive 26 may be secured, for example, near the gaps 24 to releasably secure the modules 16 to the optical integrating plate 14. In one embodiment of the present invention, the adhesive 26 may be a heat releasable adhesive such as a thermoplastic adhesive. The adhesive 26 may also be pre-attached to the plate 14 in one embodiment.

The spacers 28 and adhesive 26 may be of sufficient number, position and area that they hold the modules 16 in place, while permitting module 16 removal upon the adequate application of tensile force. In addition, the spacers 28 and adhesive 26 may provide for the control of the gap 22 between the plate 14 and the modules 16 to permit controlled filling of the gap 22 with adhesive or filler. In addition, the spacers 28 and adhesive 26 may be positioned to reduce the impact on the displayed image viewed through the plate 14. The adhesive 26 and spacers 28 may be of a material that matches the index of refraction of a permanent adhesive ultimately provided between the plate 14 and the modules 16, to reduce any effect on the visibility of the resulting image.

In one embodiment of the present invention, both the spacers 28 and the adhesive 26 are pre-attached to the optical integrating plate 14. In some cases, instead of using separate spacers 28 and adhesive 26, a single material may be utilized for both purposes. In another embodiment of the present invention, the spacers 28 and adhesive 26 may be formed of a pressure sensitive adhesive.

In accordance with one embodiment of the present invention, the modules 16 are releasably secured to the optical integrating plate 14. Thereafter, any necessary driver electronics may be coupled to the modules 16 so that the display 10 is fully operational. Thus, in the configuration shown in FIG. 3, the display 10 may be tested. If all the modules 16 are functional, the manufacturing process may continue. If one or more modules 16 are non-functional, those modules 16 may be removed. This may be done by removing the module 16 from the plate 14, for example, by softening the adhesive 26 where a thermoplastic adhesive 26 is utilized. A new functional module 16 may then be temporarily attached to the optical integrating plate 14 and the array 10 may then be retested.

Figure 4:
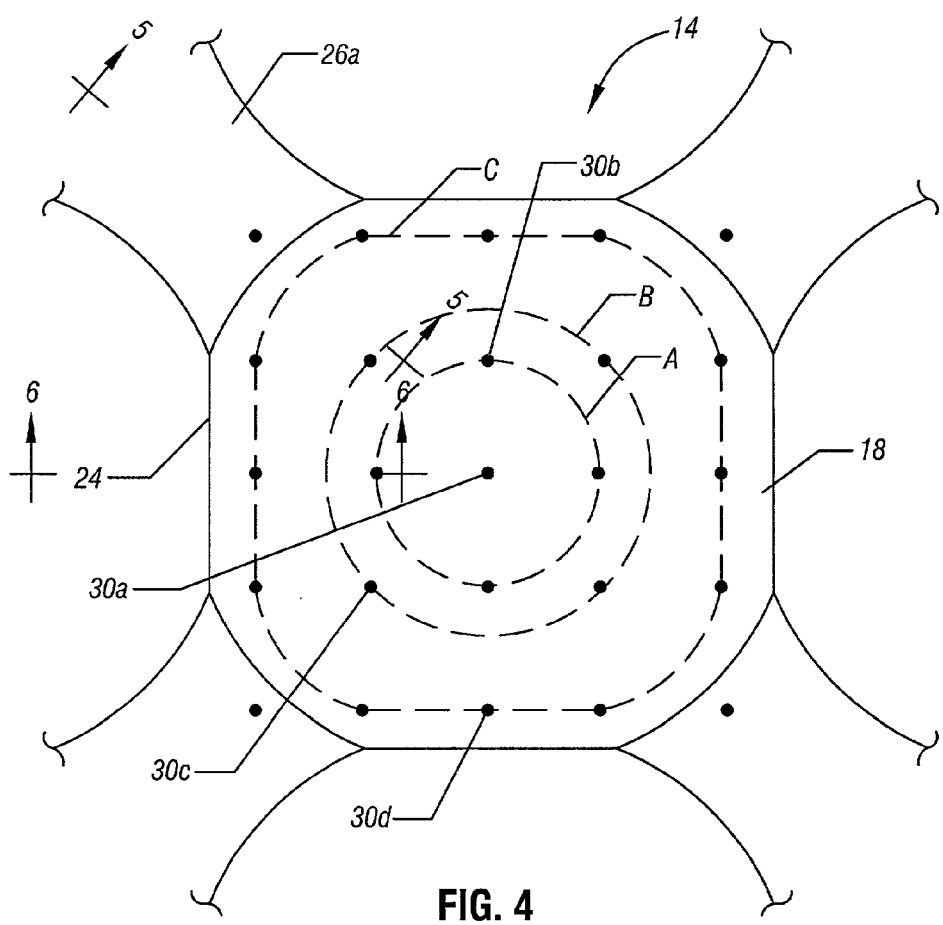
FIG. 4 is an enlarged top plan view of the tiled display shown in FIG. 3 in accordance with one embodiment of the present invention.

Continuing with the assembly process, and specifically referring to FIG. 4, in accordance with one embodiment of the present invention, a plurality of openings 30 may be provided for the injection of a permanent adhesive into the gap 22 between the plate 14 and the modules 16. A combined spacer and adhesive deposit 26a may be used in one embodiment. This deposit 26a holds the plate 14 to the modules 16 during the initial assembly and testing. Thereafter, it is desirable to inject a permanent adhesive through the openings 30 starting with the central opening 30a of each module 16.

Figure 5:
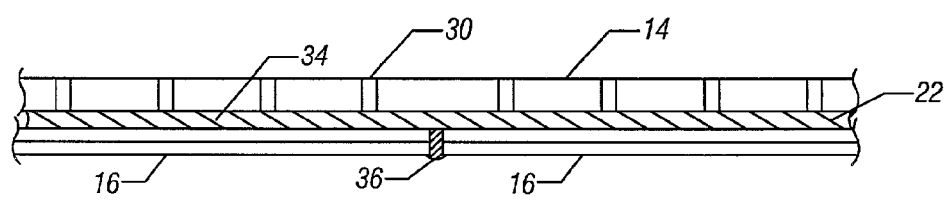
FIG. 5 is an enlarged cross-sectional view taken generally along the line 5-5 in FIG. 4.
Figure 6:
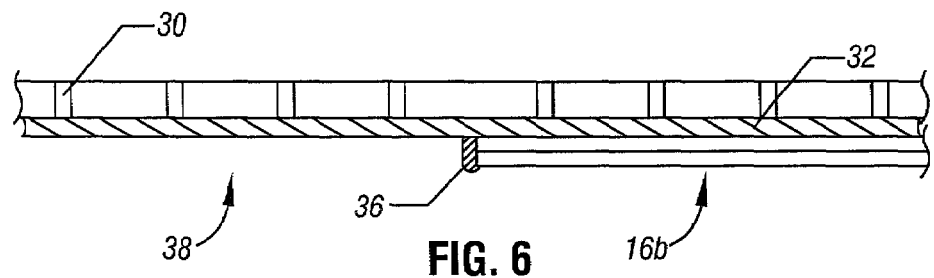
FIG. 6 is an enlarged cross-sectional view taken generally along the line 6-6 in FIG. 4 with a module removed.
Figure 7:
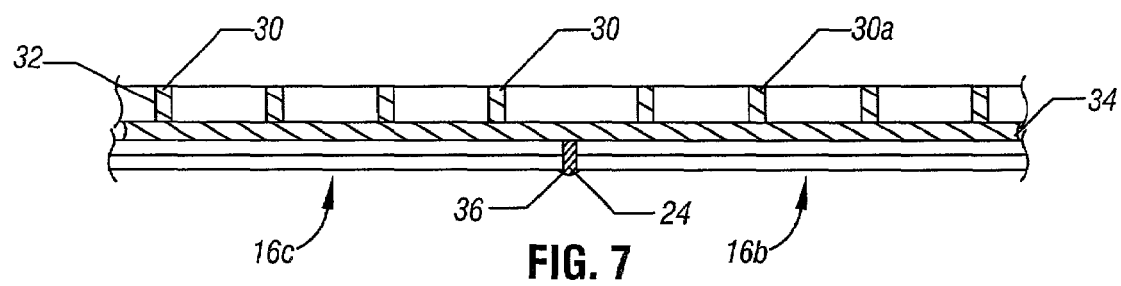
FIG. 7 is an enlarged cross-sectional view of the embodiment shown in FIG. 6 after a module has been replaced.

Thus, referring to FIG. 5, adhesive 34 is injected through the openings 30 into the gap 22 between the modules 16 and the optical integrating plate 14. Conventional epoxy adhesive may be injected in one embodiment of the present invention. Advantageously, the injected adhesive 34 has an index of refraction that matches the index of refraction of the adhesive 26a (or the spacer 28 and adhesive 26 in the embodiment of FIG. 3).

While in the embodiment of FIG. 4, the opening 30 is shown extending through the optical integrating plate 14, it is also possible to inject the adhesive 34 through the gaps 24 in another embodiment of the present invention. However, with such an approach, it is less feasible to distribute the adhesive in a way that minimizes the formation of air bubbles.

Specifically referring to FIG. 4, initially, adhesive 34 may be injected through the central opening 30a until the adhesive just reaches the radially spaced apertures 30b in the circle A. At that point, the adhesive injection through the apertures 30a may be terminated and adhesive 34 may be injected through the apertures 30b. Similarly, the adhesive 34 is continuously injected through the apertures 30b until the adhesive reaches the ring B made up of apertures 30c, which are radially outwardly displaced with respect to the apertures 30b. By offsetting the progressively radially displaced sets of apertures 30, a uniform front of advancing adhesive may be generated which moves outwardly from the center of each module 16 toward the edges of each module 16. In a similar fashion, adhesive 34 may be progressively injected through apertures 30c until the adhesive 34 reaches the ring C of apertures 30d. Thus, air can be progressively forced out through the remaining gaps 24. Thereafter, as illustrated in FIG. 5, the gaps 24 may be filled with a sealant 36.

Thus, it is possible to temporarily secure the modules 16 to an integrating plate 14 and thereafter to test the display 10 to determine whether each module 16 is suitable. If so, the modules 16 then may be bound to the optical integrating plate 14 by injecting permanent adhesive from the exterior into the gap 22 between the modules 16 and the optical integrating plate 14 in one embodiment. The display 10 may be tested while the modules 16 are releasably secured to the plate 14, avoiding the need to discard an entire display 10 because of one or more bad modules 16.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   securing a plurality of modules temporarily to a substrate to form a tiled display;
   testing the tiled display having a plurality of temporarily secured modules;
   removing any defective temporarily secured modules; and
   permanently securing the tested modules to said substrate by injecting a permanent adhesive into the region between said modules and said substrate.

2. The method of claim 1 wherein securing a plurality of modules temporarily to a substrate includes providing a releasable adhesive between said modules and said substrate.

3. The method of claim 2 including providing a thermoplastic adhesive between said modules and said substrate.

4. The method of claim 2 including providing a pressure sensitive adhesive between said modules and said substrate.

5. The method of claim 1 including pre-attaching a releasable adhesive to said substrate before securing said substrate temporarily to said modules.

6. The method of claim 1 including injecting adhesive through said substrate into said region.

7. The method of claim 6 including injecting adhesive through a first central aperture and thereafter injecting adhesive through radially displaced apertures.

8. The method of claim 1 including spacing said modules from said substrate by securing a spacer to said substrate.

9. A tiled display comprising:
   a substrate including a plurality of apertures for the injection of a filler material between said substrate and said modules; and
   a plurality of display modules secured to said substrate by releasable adhesive.

10. The display of claim 9 including a plurality of radially spaced rings of apertures in said substrate for the injection of filler material into the region between the substrate and the modules.

11. The display of claim 9 wherein said releasable adhesive is a thermoplastic adhesive.

12. The display of claim 9 wherein said releasable adhesive is a pressure sensitive adhesive.

13. The display of claim 9 wherein said modules include organic light emitting material.

14. A method comprising:
   securing a plurality of modules temporarily to a substrate to form a tiled display;
   testing the tiled display having a plurality of temporarily secured modules;
   removing any defective temporarily secured modules; and
   progressively injecting adhesive between the substrate and the modules to permanently secure the modules to the substrate.

15. The method of claim 14 including providing a releasable adhesive between said modules and said substrate.

16. The method of claim 15 including providing a thermoplastic adhesive between said modules and said substrate and heating said adhesive to remove defective modules.

17. The method of claim 15 including providing a pressure sensitive adhesive between said modules and said substrate.

18. The method of claim 14 including injecting adhesive through said substrate into the region between said substrate and said modules.

19. The method of claim 18 including injecting adhesive through a central aperture and thereafter injecting adhesive through radially displaced apertures.

20. The method of claim 14 including spacing said modules from said substrate by securing a spacer to said substrate.

* * * * *